(12) United States Patent
Andrews et al.

(10) Patent No.: US 9,508,904 B2
(45) Date of Patent: Nov. 29, 2016

(54) STRUCTURES AND SUBSTRATES FOR MOUNTING OPTICAL ELEMENTS AND METHODS AND DEVICES FOR PROVIDING THE SAME BACKGROUND

(75) Inventors: Peter S. Andrews, Durham, NC (US); Matthew Donofrio, Raleigh, NC (US)

(73) Assignee: Cree, Inc., Durham, NC (US)

( * ) Notice: Subject to any disclaimer, the term of this patent is extended or adjusted under 35 U.S.C. 154(b) by 77 days.

(21) Appl. No.: 13/017,757

(22) Filed: Jan. 31, 2011

(65) Prior Publication Data
US 2012/0193659 A1   Aug. 2, 2012

(51) Int. Cl.
H01L 33/00 (2010.01)
H01L 33/48 (2010.01)
H01L 33/54 (2010.01)

(52) U.S. Cl.
CPC ............. *H01L 33/486* (2013.01); *H01L 33/54* (2013.01); *H01L 2924/0002* (2013.01); *H01L 2933/005* (2013.01)

(58) Field of Classification Search
CPC .................................................. H01L 33/0095
USPC ............. 313/499, 501, 502; 257/98, 99, 100
See application file for complete search history.

(56) References Cited

U.S. PATENT DOCUMENTS

| | | |
|---|---|---|
| 2,736,671 A | 2/1956 | Ransburg et al. |
| 4,415,123 A | 11/1983 | Ikeuchi |
| 4,918,497 A | 4/1990 | Edmond |
| 4,966,862 A | 10/1990 | Edmond |
| 5,027,168 A | 6/1991 | Edmond |
| 5,210,051 A | 5/1993 | Carter, Jr. |
| 5,338,944 A | 8/1994 | Edmond et al. |
| 5,393,993 A | 2/1995 | Edmond et al. |
| 5,416,342 A | 5/1995 | Edmond et al. |
| 5,523,589 A | 6/1996 | Edmond et al. |
| 5,604,135 A | 2/1997 | Edmond et al. |
| 5,629,566 A * | 5/1997 | Doi ....................... H01L 21/563 257/711 |
| 5,631,190 A | 5/1997 | Negley |
| 5,739,554 A | 4/1998 | Edmond et al. |
| 5,912,477 A | 6/1999 | Negley |
| 5,959,316 A | 9/1999 | Lowery |
| 5,998,925 A | 12/1999 | Shimizu et al. |
| 6,120,600 A | 9/2000 | Edmond et al. |
| 6,187,606 B1 | 2/2001 | Edmond et al. |
| 6,201,262 B1 | 3/2001 | Edmond et al. |
| 6,576,488 B2 | 6/2003 | Collins et al. |

(Continued)

FOREIGN PATENT DOCUMENTS

| | | |
|---|---|---|
| CN | 1476640 A | 2/2004 |
| CN | 1836339 A | 9/2006 |

(Continued)

OTHER PUBLICATIONS

International Search Report and Written Opinion of the International Searching Authority, or the Declaration corresponding to International Application No. PCT/US 11/25794; Date of Mailing: May 9, 2011; 11 Pages.

(Continued)

*Primary Examiner* — Thomas L Dickey
(74) *Attorney, Agent, or Firm* — Myers Bigel, P.A.

(57) ABSTRACT

Methods are disclosed including generating a substrate surface topography that includes a mounting portion that is higher than a relief portion that defines a perimeter of the mounting portion.

6 Claims, 12 Drawing Sheets

(56) References Cited

U.S. PATENT DOCUMENTS

| | | | |
|---|---|---|---|
| 6,924,596 B2 | 8/2005 | Sato et al. | |
| 6,960,878 B2 | 11/2005 | Sakano et al. | |
| 6,995,032 B2 * | 2/2006 | Bruhns et al. | 438/33 |
| 7,304,325 B2 | 12/2007 | Uemura et al. | |
| 7,326,583 B2 | 2/2008 | Andrews et al. | |
| 7,390,684 B2 | 6/2008 | Izuno et al. | |
| 7,442,564 B2 | 10/2008 | Andrews | |
| 7,496,662 B1 | 2/2009 | Roesch et al. | |
| 7,521,728 B2 | 4/2009 | Andrews | |
| 7,646,035 B2 | 1/2010 | Loh et al. | |
| 2002/0021085 A1 * | 2/2002 | Ng | 313/499 |
| 2002/0123164 A1 | 9/2002 | Slater et al. | |
| 2003/0006418 A1 | 1/2003 | Emerson et al. | |
| 2003/0089918 A1 | 5/2003 | Hiller et al. | |
| 2003/0189263 A1 * | 10/2003 | Sawada | H01L 23/3121 257/788 |
| 2004/0056260 A1 | 3/2004 | Slater et al. | |
| 2005/0205947 A1 * | 9/2005 | Yu et al. | 257/410 |
| 2005/0218421 A1 | 10/2005 | Andrews et al. | |
| 2005/0221518 A1 * | 10/2005 | Andrews et al. | 438/27 |
| 2005/0224821 A1 | 10/2005 | Sakano et al. | |
| 2005/0224830 A1 | 10/2005 | Blonder et al. | |
| 2006/0054076 A1 | 3/2006 | Dwilinski et al. | |
| 2006/0124953 A1 | 6/2006 | Negley et al. | |
| 2006/0186431 A1 | 8/2006 | Miki et al. | |
| 2006/0226758 A1 | 10/2006 | Sofue et al. | |
| 2006/0261338 A1 * | 11/2006 | Yamazaki et al. | 257/59 |
| 2007/0045641 A1 | 3/2007 | Yin Chua et al. | |
| 2007/0045761 A1 | 3/2007 | Basin et al. | |
| 2007/0080358 A1 | 4/2007 | Tsai | |
| 2007/0080635 A1 | 4/2007 | Wang | |
| 2007/0120135 A1 | 5/2007 | Soules et al. | |
| 2007/0128745 A1 | 6/2007 | Brukilacchio et al. | |
| 2007/0148332 A1 | 6/2007 | Lee et al. | |
| 2007/0161135 A1 | 7/2007 | Keller et al. | |
| 2007/0184629 A1 * | 8/2007 | Bogner et al. | 438/411 |
| 2007/0262339 A1 * | 11/2007 | Hussell et al. | 257/99 |
| 2008/0089053 A1 | 4/2008 | Negley | |
| 2008/0122123 A1 * | 5/2008 | Pang | 257/788 |
| 2008/0132036 A1 * | 6/2008 | Yang | 438/465 |
| 2008/0149960 A1 | 6/2008 | Amo et al. | |
| 2008/0194054 A1 * | 8/2008 | Lin et al. | 438/64 |
| 2008/0217635 A1 | 9/2008 | Emerson et al. | |
| 2008/0224236 A1 * | 9/2008 | Ren et al. | 257/407 |
| 2008/0315235 A1 | 12/2008 | Murazaki | |
| 2009/0134414 A1 | 5/2009 | Li et al. | |
| 2009/0179213 A1 | 7/2009 | Cannon et al. | |
| 2009/0218592 A1 * | 9/2009 | Hawker et al. | 257/100 |
| 2010/0123386 A1 * | 5/2010 | Chen | 313/502 |
| 2010/0155763 A1 | 6/2010 | Donofrio et al. | |
| 2010/0181582 A1 * | 7/2010 | Li et al. | 257/91 |
| 2010/0289044 A1 | 11/2010 | Krames et al. | |
| 2010/0314656 A1 * | 12/2010 | Jeong et al. | 257/99 |
| 2011/0180780 A1 | 7/2011 | Yoo et al. | |
| 2011/0248305 A1 | 10/2011 | Ling | |
| 2012/0129282 A1 | 5/2012 | Hsia et al. | |

FOREIGN PATENT DOCUMENTS

| | | |
|---|---|---|
| EP | 1198016 A2 | 4/2002 |
| EP | 1437776 A1 | 7/2004 |
| JP | 2003-282952 A | 10/2003 |
| JP | 2008 135539 A | 6/2008 |
| JP | 2008-541412 A | 11/2008 |
| JP | 2009 076749 A | 4/2009 |
| JP | 2010-080588 A | 4/2010 |
| WO | WO 2006/121197 A1 | 11/2006 |

OTHER PUBLICATIONS

International Search Report Corresponding to International Application No. PCT/US2012/023069; Date of Mailing: Jun. 4, 2012; 17 Pages.

International Preliminary Report on Patentability Corresponding to International Application No. PCT/US2011/025794; Date of Mailing: Sep. 13, 2012; 9 Pages.

Japanese Office Action Corresponding to Japanese Application No. 2012-556103; Dispatch Date: Jun. 9, 2014; Foreign Text, 3 Pages, English Translation Thereof, 4 Pages.

Japanese Office Action Corresponding to Japanese Patent Application No. 2012-556103; Dispatch Date: Oct. 21, 2013; Foreign Text, 4 Pages, English Translation Thereof, 4 Pages.

International Preliminary Report on Patentability Corresponding to International Application No. PCT/US2012/023069; Date of Mailing; Aug. 15, 2013; 12 Pages.

International Preliminary Report on Patentability Corresponding to International Application No. PCT/US2012/021630; Date of Mailing; Aug. 15, 2013; 13 Pages.

Supplementary European Search Report, corresponding to European Application No. EP 11 75 1075; Dispatch Date: Jun. 25, 2015; 9 Pages.

English Translation of Second Office Action corresponding to Chinese Application No. 201180022603.6.

* cited by examiner

STRUCTURES AND SUBSTRATES FOR MOUNTING OPTICAL ELEMENTS AND METHODS AND DEVICES FOR PROVIDING THE SAME BACKGROUND

BACKGROUND

This invention relates to coating of semiconductor devices. In particular, this invention relates to the application of optical materials to optical elements that are mounted on a substrate. In particular embodiments, the invention relates to substrates used in conjunction with the application of optical coatings, such as phosphors and/or other particles, to optical elements of a semiconductor based light emitting device, such as light emitting diode based devices. In yet other embodiments, the invention relates to spraying optical elements with phosphor and/or other particles.

Light emitting diodes (LEDs) are semiconductor devices that convert electric energy to light. Inorganic LEDs typically include an active layer of semiconductor material formed between two oppositely doped layers. When a bias is applied across the active region, holes and/or electrons are injected into the active region. Recombination of holes and electrons in the active region generates light that can be emitted from the LED. The active region may include a single and/or double heterojunction, quantum well, or multiple quantum well structures with corresponding barrier layers and may include other layers. The structure of the device, and the material from which it is constructed, determine the intensity and wavelength of light emitted by the device. Recent advances in LED technology have resulted in highly efficient solid-state light sources that surpass the efficiency of incandescent and halogen light sources, providing light with equal or greater brightness in relation to input power.

Conventional LEDs generate narrow bandwidth, essentially monochromatic light. However, it is desirable to generate polychromatic light, such as white light, using solid state light sources. One way to produce white light from conventional LEDs is to combine different wavelengths of light from different LEDs. For example, white light can be produced by combining the light from red, green and blue emitting LEDs, or combining the light from blue and amber emitting LEDs. This approach, however, requires the use of multiple LEDs to produce a single color of light, which can potentially increase the overall cost, size, complexity and/or heat generated by such a device. In addition, the different colors of light may also be generated from different types of LEDs fabricated from different material systems. Combining different LED types to form a white lamp can require costly fabrication techniques and can require complex control circuitry, since each device may have different electrical requirements and/or may behave differently under varied operating conditions (e.g. with temperature, current or time).

Light from a blue emitting LED has been converted to white light by surrounding the LED with a yellow phosphor, such as cerium-doped yttrium aluminum garnet (Ce:YAG). The phosphor material absorbs and "downconverts" some of the blue light generated by the LED. That is, the phosphor material generates light, such as yellow light, in response to absorbing the blue light. Thus, some of the blue light generated by the LED is converted to yellow light. Some of the blue light from the LED passes through the phosphor without being changed, however. The overall LED/phosphor structure emits both blue and yellow light, which combine to provide light that is perceived as white light.

LEDs have been combined with phosphor layers by dispensing a volume of phosphor-containing encapsulant material (e.g., epoxy resin or silicone) over the LED to cover the LED. In these methods, however, it can be difficult to control the geometry and/or thickness of the phosphor layer. As a result, light emitted from the LED at different angles can pass through different amounts of conversion material, which can result in an LED with non-uniform color temperature as a function of viewing angle. Because the geometry and thickness is hard to control, it can also be difficult to consistently reproduce LEDs with the same or similar emission characteristics.

Still another coating method for LEDs utilizes droplet deposition using systems similar to those in an ink-jet printing apparatus. Droplets of a liquid phosphor-containing material are sprayed from a print head. The phosphor-containing droplets are ejected from a nozzle on the print head in response to pressure generated in the print head by a thermal bubble and/or by piezoelectric crystal vibrations.

Problems with conventional methods of applying phosphor and/or other optical materials may include increased cost, complexity, clumping, dripping, settling, stratification, and/or separation, which may result in a reduced conformity and/or uniformity of the optical materials thus applied.

SUMMARY

Some embodiments of the present invention include substrates for mounting semiconductor devices. For example, a substrate may include a mounting surface having a first shape in a first plane that is at a first height. The mounting surface may be configured to receive at least one semiconductor device that includes a second shape that is substantially similar to the first shape and that includes greater area than the first shape in the first plane. Some embodiments provide a relief surface that is arranged to intersect a second plane that is substantially parallel to the first plane and that is at a second height that is lower than the first height. The relief surface may be arranged to be continuously adjacent a perimeter of the mounting surface.

In some embodiments, the relief surface includes a trench formed in the substrate around the mounting surface. Some embodiments provide that, when mounted to the mounting surface, the semiconductor device is configured to overlap a portion of the relief surface. In some embodiments, the trench includes a width of at least about 100 μm and a depth of at least about 25 μm. Some embodiments provide that the mounting surface includes a pedestal on the substrate.

Some embodiments include a third surface that is adjacent the relief surface and that includes a second height that is higher than the first height. In some embodiments, the third surface includes a reflecting surface that is configured to receive light that is emitted from a side of the at least one semiconductor device and reflect the received light in at least one direction that is substantially orthogonal to the mounting surface. Some embodiments provide that the third surface forms an oblique angle relative to the first plane.

Some embodiments of the present invention include a light emitting structure. According to some embodiments, the light emitting structure may include a semiconductor light emitting diode (LED) that includes an active region. The structure may include a substrate having a first side that includes a mounting surface that is configured to support the LED. The first side may include a relief surface that is adjacent a perimeter of the mounting surface and that is recessed from the mounting surface at a depth relative to a plane of the mounting surface to form a cavity around the perimeter of the mounting surface.

In some embodiments, the LED extends beyond the mounting surface to a position that is above a portion of the cavity along the perimeter of the mounting surface. Some embodiments provide that an encapsulant is formed on the LED. The encapsulant may include a cured shape corresponding to a meniscus of uncured encapsulant. In some embodiments, the encapsulant includes multiple light conversion particles. Some embodiments provide that the encapsulant extends into the cavity without contacting the substrate first surface. In some embodiments, the encapsulant includes a portion that is below a height that of the mounting surface of the LED. Some embodiments provide that the encapsulant does not contact the relief surface. In some embodiments, the encapsulant includes a plurality of light conversion particles. Some embodiments provide that the light conversion materials include a phosphor particle.

Some embodiments include a conformal layer directly on the LED. The conformal layer may include edges that are positioned over a portion of the cavity along the perimeter of the mounting surface. Some embodiments provide that the LED includes a first coefficient of thermal expansion and the conformal layer includes a second coefficient of thermal expansion that is greater than the first coefficient of thermal expansion. The cavity may be configured to provide relief corresponding to thermal expansion of the conformal layer. In some embodiments, the conformal layer includes phosphor particles and a binder material.

Some embodiments provide that the mounting surface includes a pedestal relative to other portions of the first side. In some embodiments, the relief surface includes a trench that is provided on the first side.

Some embodiments include a first material in the cavity and a second material formed over the LED and engaging the first material. The first material may include a first elastic modulus and the second material may include a second elastic modulus that is greater than the first elastic modulus. In some embodiments, the first material includes a coefficient of thermal expansion that is different from the coefficient of thermal expansion of the second material. Some embodiments provide that coefficient of thermal expansion of the second material is greater than that of the first material. In some embodiments, the first material is applied before the second material and the second material is formed above a bottom surface of the LED that extends beyond the mounting surface to a position that is above a portion of the cavity.

Some embodiments of the present invention includes methods that include generating a substrate surface topography that includes a mounting portion that is higher than a relief portion that defines a perimeter of the mounting portion. Some embodiments provide that the substrate surface topography may be generated by trenching the substrate corresponding to the relief portion that defines the perimeter of the mounting portion. In some embodiments, the substrate may be etched to form a trench corresponding to the relief portion. Some embodiments provide that the trench is interrupted by a portion that includes a different depth than a depth of the cavity around the perimeter of the mounting surface. Some embodiments provide that the mounting portion may be built up on the substrate using at least one layer of mounting surface material.

Some embodiments include positioning a semiconductor light emitting diode (LED) on the mounting portion in a position to extend beyond a perimeter of the mounting portion. The LED may be positioned on a first surface of the mounting portion and an encapsulant may be formed on the LED. The encapsulant may form a meniscus that extends beyond the mounting portion without contacting the first surface of the mounting portion. Some embodiments provide that the encapsulant includes multiple light conversion particles. In some embodiments, the encapsulant extends into a cavity corresponding to the relief portion.

Some embodiments provide that the encapsulant is formed by dispensing a fluid volume of the encapsulant in a mini-glob on a top surface of the LED. The LED may be heated relative to the encapsulant before the encapsulant is dispensed. Heating the LED may reduce a viscosity of the encapsulant when applied to the LED.

Prior to positioning the LED on the mounting portion, a conformal coating may be applied to a top surface of the LED. The edges of the conformal coating may be positioned over a portion of a cavity that corresponds to the relief portion when the LED is mounted. Some embodiments provide that applying the conformal coating includes applying the conformal coating to multiple LEDs on a wafer and then separating the LEDs before positioning the LED on the mounting portion.

Some embodiments include applying a first material that includes a first elastic modulus in a cavity corresponding to the relief portion and applying a second material formed over the LED and engaging the first material. The second material including a second elastic modulus may be greater than the first elastic modulus. In some embodiments, the first material includes a first coefficient of thermal expansion and the second material includes a second coefficient of thermal expansion that is greater than the first coefficient of thermal expansion. The first material may be applied before the second material is applied and the first material may be in a space that is below a bottom surface of the LED that extends beyond the mounting surface.

Some embodiments include generating the substrate surface topography on a wafer that includes multiple mounting portions that are higher than multiple relief portions that define respective perimeters of one of the mounting portions. Some embodiments include positioning ones of multiple light emitting diodes (LEDs) on ones of the mounting portions. In some embodiments, ones of the LEDs may be positioned based on relative emission characteristics of the ones of the LEDs.

Some embodiments of the present invention include a light emitting structure that includes a semiconductor light emitting diode (LED) that includes a first surface and a second surface that is substantially opposite the first surface. An encapsulant is formed on the first surface of the LED and includes a portion that is below a height of the second surface of the LED.

In some embodiments, the first surface includes a light emitting surface and wherein the second surface includes a mounting surface that is at a height below a height of the light emitting surface. Some embodiments provide that the encapsulant includes multiple light conversion particles. In some embodiments, at least one of the light conversion materials includes a phosphor particle.

Some embodiments provide that the encapsulant includes a conformal layer directly on the LED and ledges that extend from the perimeter of the LED. Some embodiments include a mounting structure that includes a cavity around a mounting surface. In some embodiments, the LED has a first coefficient of thermal expansion and the encapsulant has a second coefficient of thermal expansion that is greater than the first coefficient of thermal expansion. The cavity is configured to provide relief corresponding to thermal expansion of the conformal layer.

Some embodiments provide that the encapsulant includes phosphor particles and a binder material.

BRIEF DESCRIPTION OF THE DRAWINGS

The accompanying drawings, which are included to provide a further understanding of the invention and are incorporated in and constitute a part of this application, illustrate certain embodiment(s) of the invention.

DETAILED DESCRIPTION

Figure 1A:
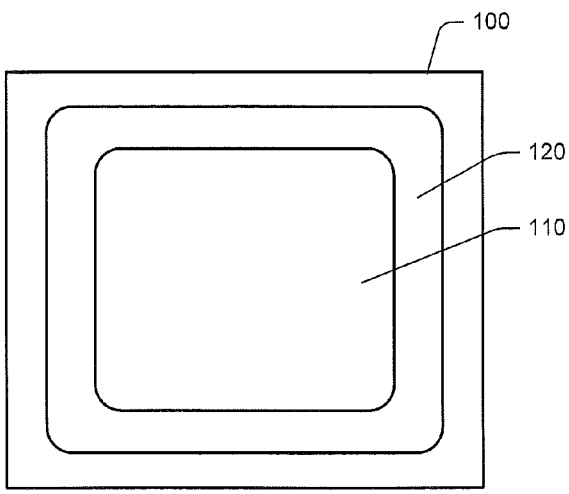
FIGS. 1A and 1B are schematic top and side cross-sectional views, respectively, illustrating a substrate for mounting a semiconductor device according to some embodiments of the present invention.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Some embodiments of the present invention relate to application of an optical material to an optical element that is mounted on a substrate. The optical element may include a semiconductor light emitting device.

Various embodiments of the present invention for packaging a semiconductor light emitting device will be described herein. As used herein, the term semiconductor light emitting device may include a light emitting diode, laser diode and/or other semiconductor device which includes one or more semiconductor layers, which may include silicon, silicon carbide, gallium nitride and/or other semiconductor materials, a substrate which may include sapphire, silicon, silicon carbide and/or other microelectronic substrates, and one or more contact layers which may include metal and/or other conductive layers. In some embodiments, ultraviolet, blue and/or green light emitting diodes may be provided. Red and/or amber LEDs may also be provided. The design and fabrication of semiconductor light emitting devices are well known to those having skill in the art and need not be described in detail herein.

For example, the semiconductor light emitting device may be gallium nitride-based LEDs or lasers fabricated on a silicon carbide substrate such as those devices manufactured and sold by Cree, Inc. of Durham, N.C. The present invention may be suitable for use with LEDs and/or lasers as described in U.S. Pat. Nos. 6,201,262; 6,187,606; 6,120,600; 5,912,477; 5,739,554; 5,631,190; 5,604,135; 5,523,589; 5,416,342; 5,393,993; 5,338,944; 5,210,051; 5,027,168; 5,027,168; 4,966,862 and/or 4,918,497, the disclosures of which are incorporated herein by reference as if set forth fully herein. Other suitable LEDs and/or lasers are described in published U.S. Patent Publication No. US 2003/0006418 A1 entitled Group III Nitride Based Light Emitting Diode Structures With a Quantum Well and Superlattice, Group III Nitride Based Quantum Well Structures and Group III Nitride Based Superlattice Structures, published Jan. 9, 2003, as well as published U.S. Patent Publication No. US 2002/0123164 A1 entitled Light Emitting Diodes Including Modifications for Light Extraction and Manufacturing Methods Therefor. Furthermore, phosphor coated LEDs, such as those described in U.S. Patent Publication No. 2004/0056260 A1, entitled Phosphor-Coated Light Emitting Diodes Including Tapered Sidewalls and Fabrication Methods Therefor, the disclosure of which is incorporated by reference herein as if set forth fully, may also be suitable for use in embodiments of the present invention. The LEDs and/or lasers may be configured to operate such that light emission occurs through the substrate. In such embodiments, the substrate may be patterned so as to enhance light output of the devices as is described, for example, in the above-cited U.S. Patent Publication No. US 2002/0123164 A1. Furthermore, the present invention may be suitable for use with light emitting devices and methods therefore, such as those described in U.S. Pat. Nos. 7,326,583, 7,442,564, 7,521,728 and 7,646,035, the disclosures of which are incorporated by reference as if set forth fully herein.

Optical materials may include wavelength converting materials, luminescent materials, scattering particles, and/or light filters, among others. Particles as discussed herein may include small and/or large diameter particles. For example, some embodiments provide that small particles can be about 5 microns or less mean diameter particle size and can include nanoparticles. Large diameter particles can include about 15 microns or greater mean diameter size, such as, for example, 17 microns or greater.

Particles, such as phosphor particles, may be included and/or suspended in an encapsulant that may be deposited on an LED chip. In some embodiments, the encapsulant is deposited on the LED chip as a droplet or miniglob, which cures in a shape corresponding to a meniscus that forms when the miniglob is deposited on the LED. If, before curing, the meniscus of the miniglob breaks, then the phosphor location relative to an emission pattern of the LED may be inconsistent, which may result in undesirable variance of emission performance. When applied to a LED mounted on a conventional substrate, the meniscus may sag and, in some circumstances touch or "kiss" the substrate, which may result in the meniscus breaking. As described herein, a substrate including a relief portion around a mounting portion may allow the miniglob to retain the meniscus even when sagging occurs.

The amount of encapsulant/phosphor particles deposited on an LED may impact the emission performance of the device. In this regard, depositing the miniglob in a repeatable fashion may provide consistent emission performance. Accordingly, some embodiments herein provide that heating the encapsulant prior to the deposition operation serves to decrease the viscosity of the encapsulant, which increases the repeatability of the tear-off of the miniglob from the dispenser. The reduction in viscosity, however, may decrease the strength of a meniscus, which may result in greater sagging than in a higher viscosity fluid.

Figure 1B:
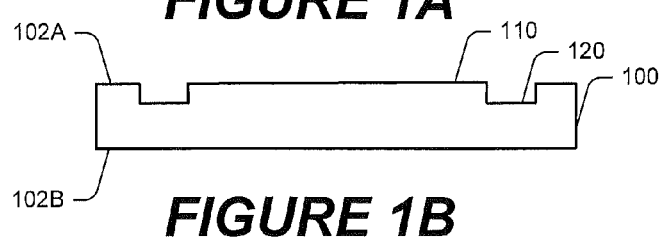

Reference is now made to FIGS. 1A and 1B, which are schematic top and side cross-sectional views, respectively, illustrating a substrate for mounting a semiconductor device according to some embodiments of the present invention. As used herein, the substrate may be a submount and may include an upper surface 102A and a lower surface 102B. The submount may include a printed circuit board (PCB), an aluminum block, an alumina, aluminum nitride or silicon wafer, or any other suitable substrate material. Additionally, some embodiments provide that the submount includes a plurality of patterned metal features (not shown here) formed on the upper surface 102A. The patterned metal features may include, for example, a die attach pad, a wire bond pad, and/or electrodes, among others.

The conductive features on the upper surface 102A may be formed, for example, using a plating process. A plating process may be used to plate a thin or thick metallic film on a substrate. In a typical plating process, a titanium adhesion layer and a copper seed are sequentially sputtered onto a substrate. Then, a thickness of copper may be plated onto the copper seed. Thus, a plating process may be utilized to form a metal film having a characteristic structure. A deposited metal film may be patterned using standard lithographic processes to produce metal films on the substrate having desired patterns. Alternatively, the adhesion layer and seed may be sputtered using, for example, a metal mask to form a desired pattern. A plating process may also be used to form conductive metal vias through the submount 100.

The substrate 100 includes a mounting surface 110 that is configured to receive at least one semiconductor device. Some embodiments provide that the mounting surface 110 includes a shape that is substantially similar to the shape of the semiconductor device. For example, a substrate 100 for semiconductor including a substantially square or rectangular footprint may include a mounting surface 110 having a substantially square or rectangular shape corresponding to the semiconductor device. In some embodiments, the mounting surface 110 may be dimensioned to be smaller than the semiconductor device such that a portion of the semiconductor device extends beyond the mounting surface 110. As illustrated in FIG. 1B, the mounting surface 110 may be in the same plane as the upper surface 102A although embodiments are not so limited.

The substrate 100 includes a relief surface 120 that is arranged around the perimeter of the mounting surface 110. As illustrated in FIG. 1B, the relief surface 120 is lower than the mounting surface 110 and may be formed as a trench in the upper surface 102A of the substrate 100. In this manner, the relief surface 120 may define a cavity in the trench around the mounting surface 110.

Figure 2A:
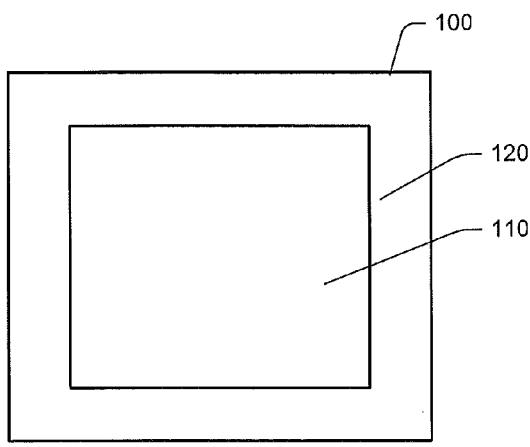
FIGS. 2A and 2B are schematic top and side cross-sectional views, respectively, illustrating a substrate for mounting a semiconductor device according to some embodiments of the present invention.
Figure 2B:
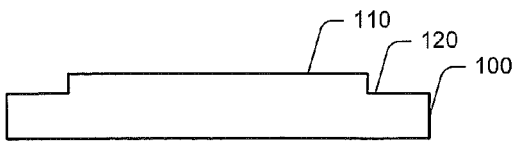

Brief reference is now made to FIGS. 2A and 2B, which are schematic top and side cross-sectional views, respectively, illustrating a substrate 100 for mounting a semiconductor device according to some embodiments of the present invention. Some embodiments provide that the mounting surface 110 is configured as a pedestal that rises above the relief surface 120. The pedestal may be built-up by selectively adding and/or forming one or more layers on the substrate 100 and/or by removing the portion of the substrate 100 that corresponds to the relief portion 120.

Figure 3:
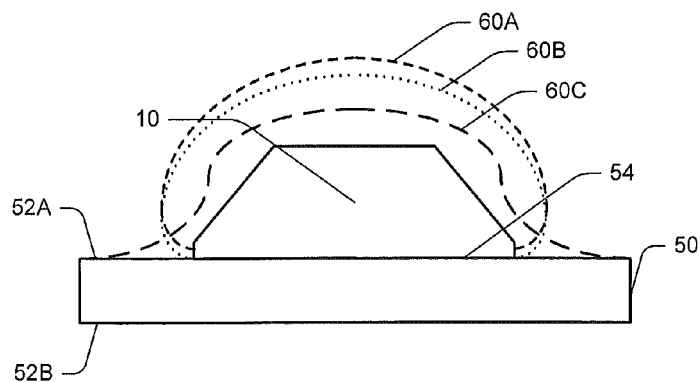
FIG. 3 is a schematic side cross-sectional view illustrating an encapsulated semiconductor device mounted on a conventional substrate.

Reference is now made to FIG. 3 is a schematic side cross-sectional view illustrating an encapsulated semiconductor device mounted on a conventional substrate. The substrate 50 includes an upper surface 52A and a lower surface 52B that is opposite the upper surface 52A. A mounting surface 54 on the upper surface 52A is configured to support a semiconductor device. As disclosed herein, the semiconductor device may include an LED 10, among others. Although not illustrated herein, a metalized layer may be provided between the LED 10 and the mounting surface 54.

A droplet of encapsulant, also described above as a miniglob 60A-C, may be deposited onto the LED 10. As described above, the encapsulant may include optical materials such as wavelength converting materials, luminescent materials, scattering particles, and light filters, among others. For example, phosphor particles, may be included and/or suspended in the encapsulant that are operable to convert a portion of the light emitted from the LED into light having a different wavelength. As deposited, an initial shape of the cured miniglob 60A may not contact the substrate 50 and the shape may correspond to an unbroken meniscus. However, a number of factors may cause a miniglob 60B to contact the substrate 50. For example, a decreased viscosity may result in a weaker meniscus and allow the miniglob 60B to sag or creep down a side and/or edge of the LED 10. Additionally, if the mounting surface 54 of the substrate 50 is not level or orthogonal to the direction of gravitational forces, one side of the miniglob 60B may sag or shift down to contact the substrate 50.

Once the miniglob 60B contacts the substrate 50, the meniscus formed thereby may break causing a minoglob 60C that spreads out on the upper surface 52A of the substrate 50. Once the meniscus breaks, a portion of the optical materials in the enapsulant may no longer be available relative to the light emitted from the LED and thus the total emission performance may be altered and/or compromised. For example, if the optical materials are phosphors, fewer phosphor particles may be positioned to receive and convert the light from the LED, which may shift the perceived color of the combined light from the device.

Figure 4:
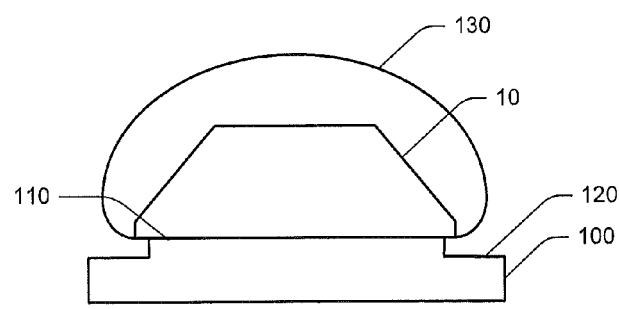
FIG. 4 is a schematic side cross-sectional view illustrating an encapsulated semiconductor device mounted on a substrate according to some embodiments of the present invention.

Reference is now made to FIG. 4, which is a schematic side cross-sectional view illustrating an encapsulated semiconductor device mounted on a substrate according to some embodiments of the present invention. As discussed above regarding FIGS. 1A-2B, the substrate 100 includes a relief surface 120 that is arranged around the perimeter of the mounting surface 110. As the relief surface 120 is lower than the mounting surface 110, if the miniglob 130 of encapsulant shifts or sags to the bottom of the LED 10, the space around the pedestal of the mounting surface 110 allows the meniscus hold instead of breaking upon contact with the substrate 100.

Figure 5A:
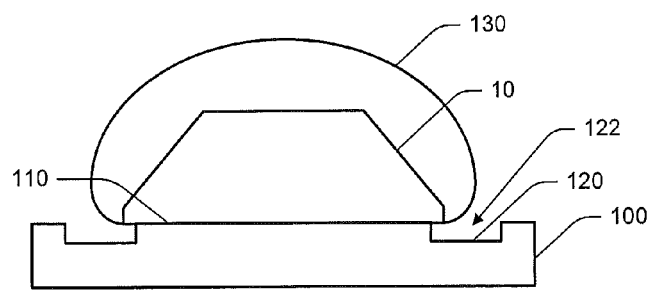
FIGS. 5A and 5B are schematic side cross-sectional views of an encapsulated semiconductor devices including different encapsulant meniscus profiles on a substrate according to some embodiments of the present invention.
Figure 5B:
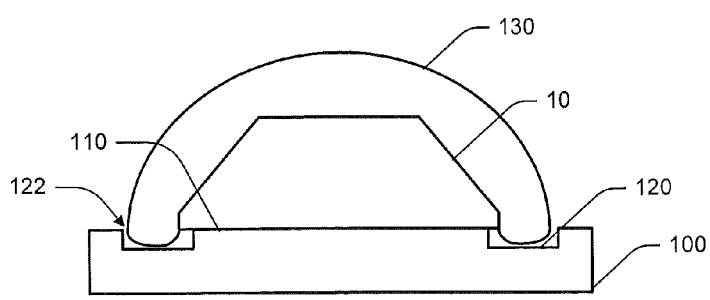

Brief reference is made to FIGS. 5A and 5B, which are schematic side cross-sectional views of an encapsulated semiconductor devices including different encapsulant meniscus profiles on a substrate according to some embodiments of the present invention. Some embodiments provide that the relief surfaces 120 of FIGS. 5A and 5B are trenches that may surround the mounting surfaces 110 that support the LED 10. As illustrated in FIG. 5B, the miniglob 130 may realize a significant sagging without contacting the substrate 100 by virtue of the cavity 122 corresponding to the relief surface 120.

In some embodiments, the mounting surface 110 may be dimensioned such that a footprint of the LED 10 is larger than the mounting surface 110. In this regard, when mounted to the substrate 100, the LED 10 may overlap a portion of the relief surface 120. Although not illustrated, a bottom edge of the LED 10 may include edge treatment such as, for example, chamfering, among others.

Exemplary embodiments of the substrate 100 provide that the height of the pedestal (or the depth of the trench) may be in a range between 15 µm and 100 µm, a range between 20 µm and 50 µm, or a range between 20 µm and 30 µm. For example, in some embodiments, the height difference between the mounting surface 110 and the relief surface 120 may be about 25 µm.

Exemplary embodiments of the substrate 100 provide that the width of the trench (relief surface 120) may be in a range between 50 µm and 200 µm, a range between 70 µm and 150 µm, or a range between 80 µm and 120 µm. For example, in some embodiments, the width of the trench corresponding to the relief surface 120 may be about 100 µm.

Figure 6:
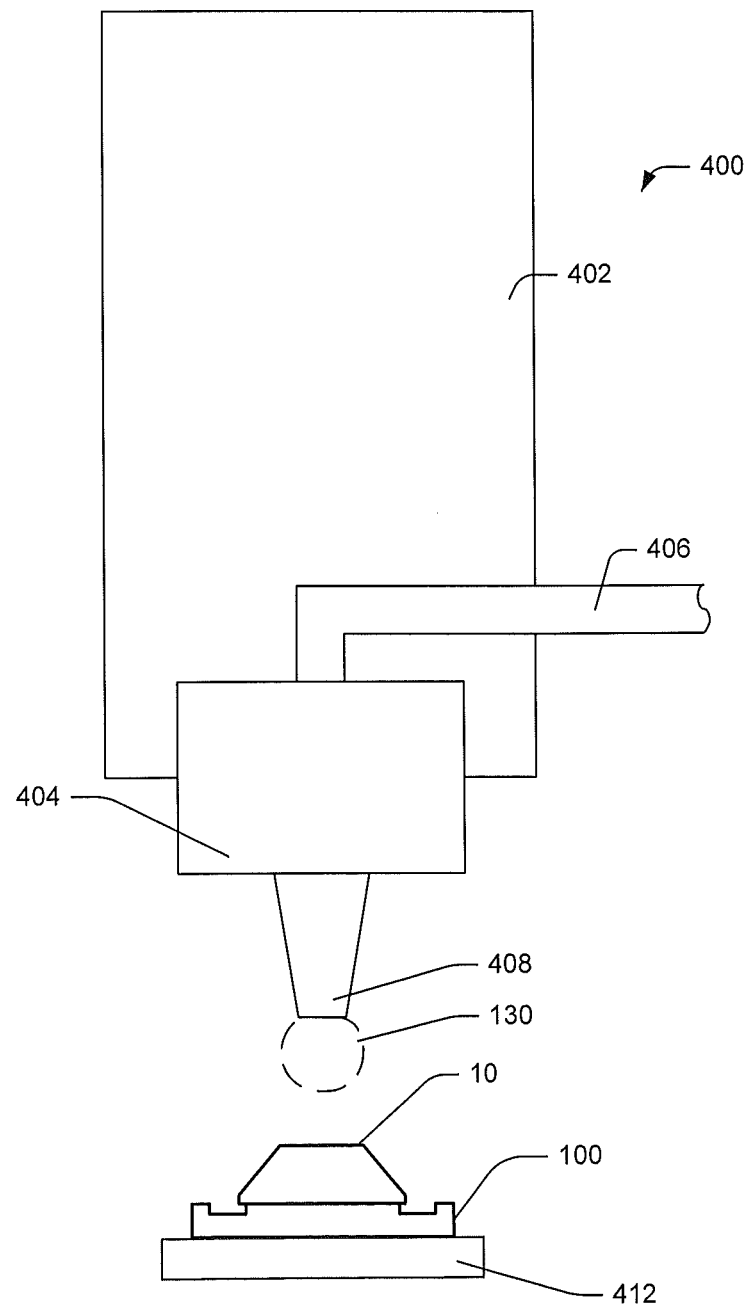
FIG. 6 is a schematic illustration of a system for dispensing an encapsulant material for use in packaging a light emitting device according to some embodiments of the invention.

Reference is now made to FIG. 6, which is a schematic illustration of a system for dispensing an encapsulant material for use in packaging a light emitting device according to some embodiments of the invention. The system 400 includes a frame 402, which may be attached to an articulated arm (not shown) configured to controllably move the frame 402 in the X, Y, and Z dimensions. A needle mount member 404 is mounted on the frame 402, and an encapsulant supply line 406 is coupled to the needle mount member 404 for supplying a quantity of encapsulant material to a hollow dispensing needle 408 mounted on the needle mount member 404. In some embodiments, a heater 412 may be provided for heating the LED 10 to reduce the viscosity of the encapsulant to regulate the tear-off characteristics of the encapsulant 130 when it is dispensed on the LED 10. Some embodiments provide that the heater 412 includes a thermally conductive heating surface through which heat is transferred to the LED 10 via the substrate 100 prior to dispensing the encapsulant. In some embodiments, the heater 412 may use a heat transfer media, such as, for example, heated air and/or gases, to transfer heat to the LED 10. Embodiments of the heater 412 may include electrically resistive and/or conductive and/or combustion related heat generating elements. In some embodiments, the LED 10 may be warmed to a temperature ranging from about 25 degrees Celsius to about 40 degrees Celsius when the encapsulant is about twenty degrees Celsius. Some embodiments provide that the temperature range may be from about 30 degrees Celsius to about 35 degrees Celsius when the encapsulant is about 20 degrees Celsius. In some embodiments, the temperature of the LED 10 may be at least about 33 degrees Celsius when the encapsulant is about 20 degrees Celsius.

A bead of encapsulant 130 may be formed at the tip of the dispensing needle 408. As discussed above, the bead of encapsulant 130 may be dispensed onto the substrate 10 and/or the LED chip 10 by contacting the encapsulant 130 to a surface of the substrate 100 and/or the LED chip 10. The viscosity, quantity and/or other properties of the material used for a dispense may be selected such that, for example, a miniglob forms by virtue of the meniscus of the deposited encapsulant 130.

Figure 7:
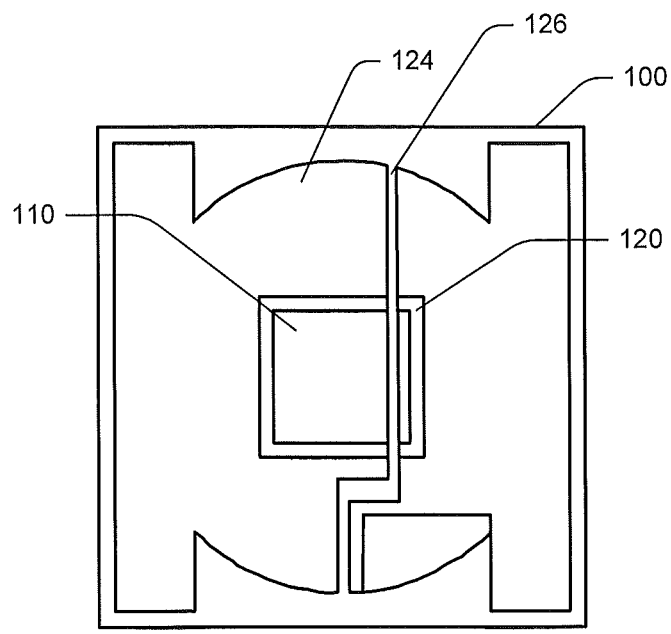
FIG. 7 is schematic top view illustrating a substrate for mounting a semiconductor device according to some embodiments of the present invention.

Reference is now made to FIG. 7, which is schematic top view illustrating a substrate for mounting a semiconductor device according to some embodiments of the present invention. The substrate 100 includes the mounting portion 110 that is surrounded by the relief portion 120. The substrate may further include one or more metalized surfaces 124 and one or more isolation channels 126 that may be formed therein.

Figure 8:
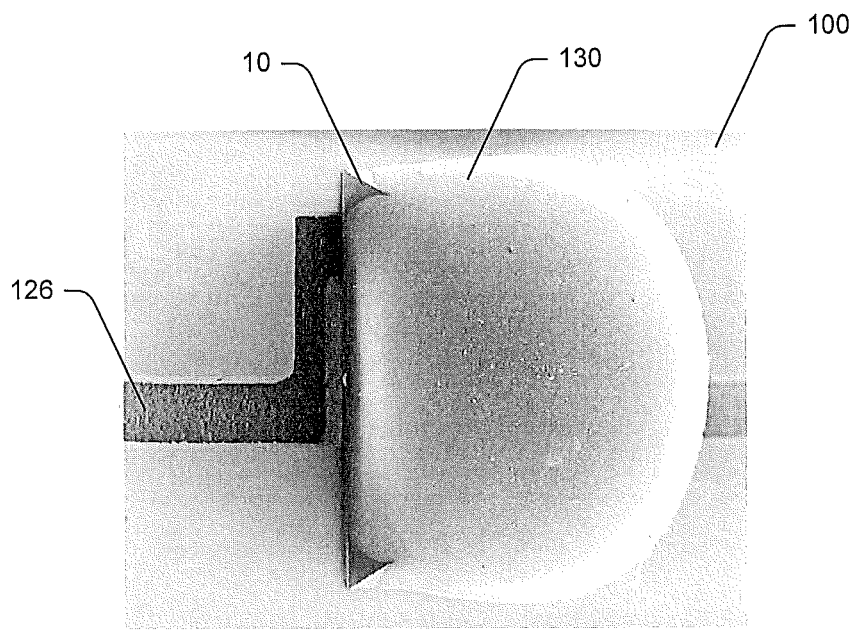
FIG. 8 is a magnified photograph illustrating a perspective view of an encapsulated semiconductor device mounted on a substrate according to some embodiments of the present invention.

Brief reference is now made to FIG. 8, which is a magnified photograph illustrating a perspective view of an encapsulated semiconductor device mounted on a substrate according to some embodiments of the present invention. The semiconductor device includes the substrate 100 and an LED 10 mounted thereon. A miniglob of encapsulant 130 is formed on the LED 10 and substantially maintains the meniscus shape of the encapsulant as applied. The isolation channel 126 is also shown extending from one side of the LED 10 to the other side of the LED 10.

Figure 9:
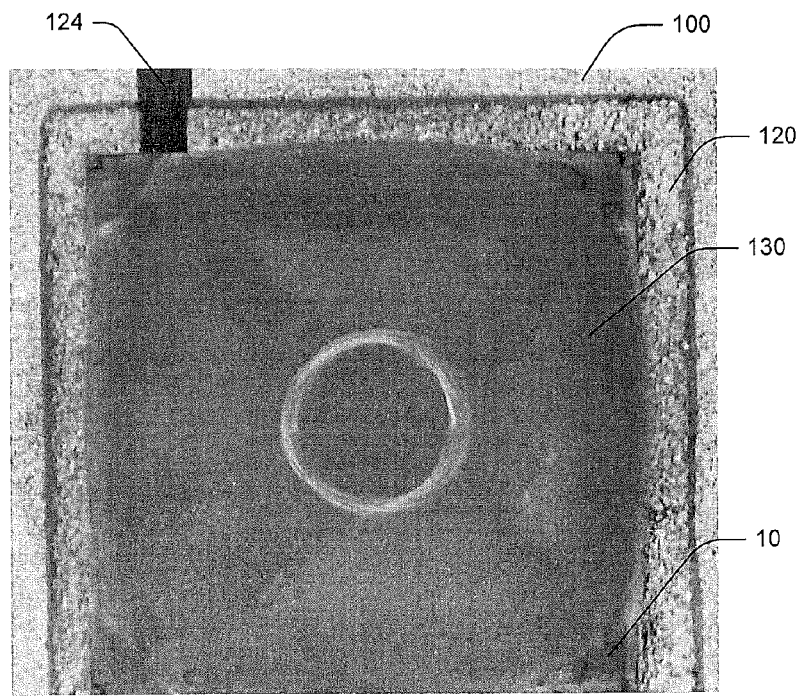
FIG. 9 is a magnified photograph illustrating a top view of an encapsulated semiconductor device mounted on a substrate according to some embodiments of the present invention.

Brief reference is now made to FIG. 9, which is a magnified photograph illustrating a partial top view of an encapsulated semiconductor device mounted on a substrate according to some embodiments of the present invention. The substrate 100 includes a mounting portion that is obscured by the placement of the LED 10 and a relief portion 120 that is around a perimeter of the mounting portion. Note that the LED 10 may extend beyond the mounting portion to partially overlap a cavity corresponding to the relief portion 120. Encapsulant 130 is formed over the LED 10 and substantially maintains a meniscus shape of the encapsul ant as applied. An isolation channel 126 is also shown extending from under the LED 10.

Figure 10:
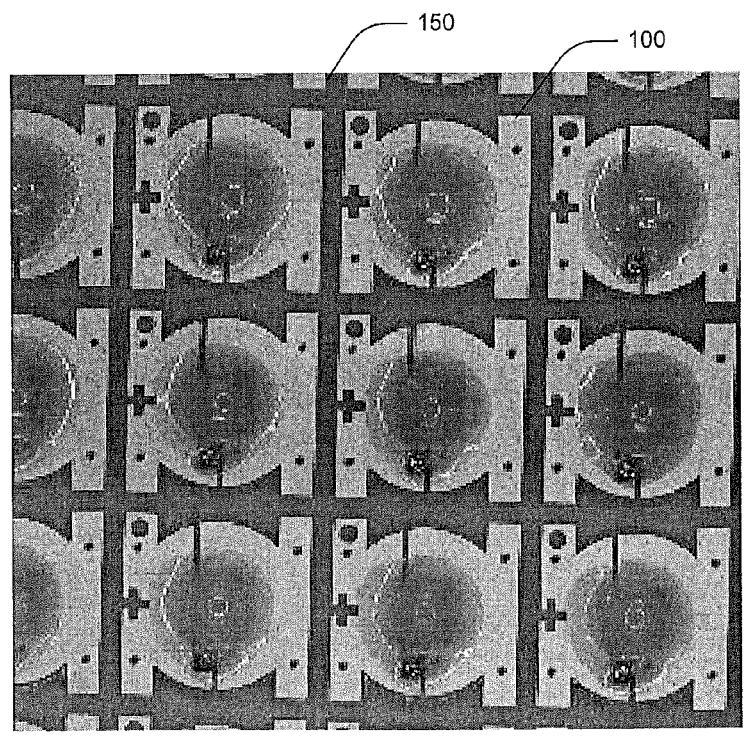
FIG. 10 is a magnified photograph illustrating a top view of a wafer including multiple substrates according to some embodiments of the present invention and encapsulated semiconductor devices mounted thereon.

Brief reference is now made to FIG. 10, which is a magnified photograph illustrating a top view of a wafer including multiple regions that each are substrates according to some embodiments of the present invention and encapsulated semiconductor devices mounted thereon. Some embodiments provide that multiple regions are provided on the wafer 150 corresponding to multiple substrates 100. Each of the multiple substrates 100 may include a mounting portion and a relief portion that is around a perimeter of the mounting portion. As photographed, LED's and corresponding encapsulant are formed on each of the regions corresponding to the multiple substrates 100.

In some embodiments, the LEDs may be placed on the respective substrates 100 according to previously determined emission characteristics. Some embodiments provide that the LEDs are grouped into different groups and/or bins according to emission characteristics, such as, for example, color temperature, chromaticity, and/or luminance, among others. In this regard, different zones of the wafer 150 may be defined such that LED's corresponding to specific groups and/or bins may be placed in specific zones. For example, the location of the LED's on the wafer 150 may be mapped according to LED emission characteristics. Once the LEDs are mapped according to emission characteristics, contents of the encapsulant that is deposited on the LEDs may be varied responsive thereto. For example, depending on the emission characteristics of a particular group of LEDs, encapsulants including different types and/or quantities of phosphors may be applied to accommodate the group differences. In this manner, an increase in the overall uniformity of the emission characteristics of the groups of LEDs may be improved.

Figure 11:
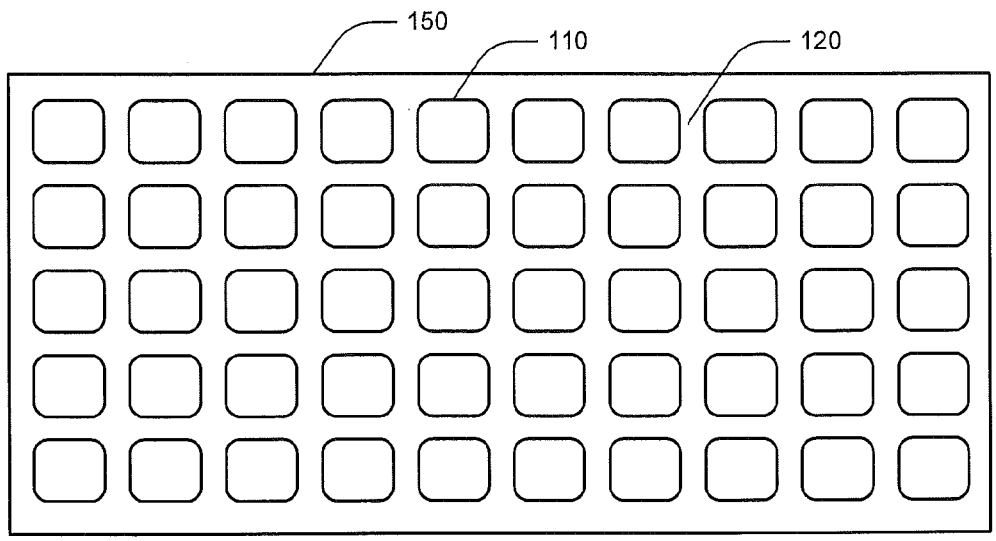
FIG. 11 is a schematic top view illustrating a top view of a wafer including multiple substrates according to some embodiments of the present invention.
Figure 12:
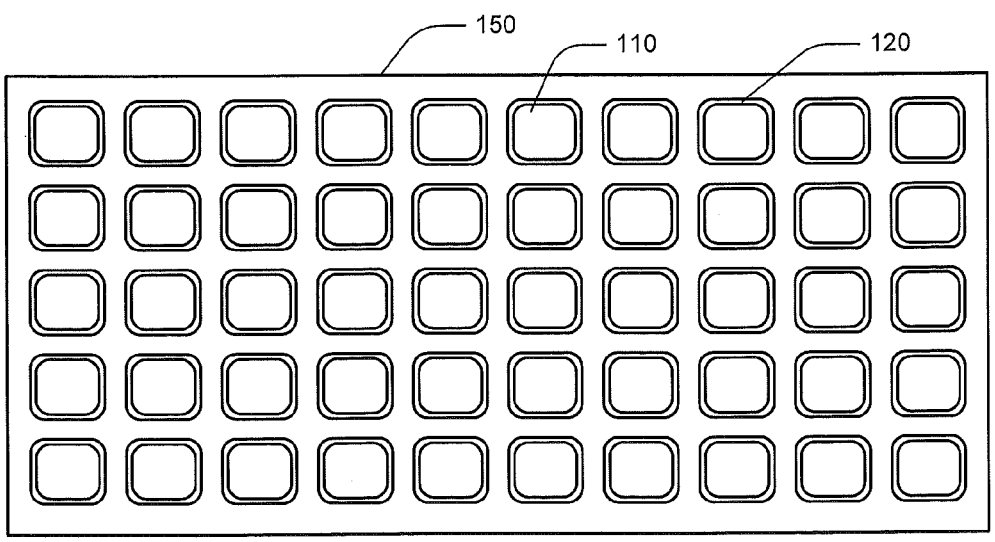
FIG. 12 is a schematic top view illustrating a top view of a wafer including multiple substrates according to some embodiments of the present invention.

Brief reference is now made to FIGS. 11 and 12, which are schematic top views illustrating a top view of a wafers including multiple substrates according to some embodiments of the present invention. Referring to FIG. 11, the wafer 150 may include multiple mounting portions 110 that are higher than the relief portions 120 that surround the mounting portions 110. Stated differently, FIG. 11 illustrates a wafer including multiple mounting portions that are configured as pedestals. In this regard, the non-pedestal portions may be relief portions 120. In contrast, referring to FIG. 12, the wafer 150 may include multiple mounting portions 110 that may be each surrounded by a relief portion 120. As illustrated, the relief portion 120 may be formed as a trench or recess in the surface of the wafer 150. The individual substrates may be separated before or after LEDs are mounted thereon.

Figure 13:
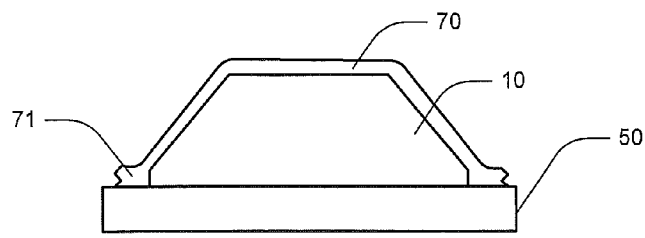
FIG. 13 is a schematic side cross-sectional view illustrating a conformally coated semiconductor device mounted on a substrate without a relief portion.

Reference is now made to FIG. 13, which is a schematic side cross-sectional view illustrating a conformally coated semiconductor device mounted on substrate without a relief portion. For example, the semiconductor device may include an LED 10. A conformal coating 70 that includes, for example, optical materials, may be applied to the LED 10. The conformal coating 70 may be applied to a large number of LEDs 10 in a batch operation using, contact coating and/or spraying methods, among others. For example, a carrier liquid containing optical materials may be conveyed to a spray nozzle. The carrier liquid is sprayed onto the LEDs via the spray nozzle. In particular, pressurized gas supplied to the spray nozzle through a high pressure gas supply line may atomize the carrier liquid and direct the optical materials towards the optical element where the optical materials are conformally deposited.

A large quantity of the LEDs 10 may be arranged with a thin frame therebetween in a high density arrangement for batch coating. The LEDs 10 may be arranged as a sorted die sheet wherein ones of the LEDs 10 having similar emission characteristics are arranged together in a tightly packed array.

Once the conformal coating 70 is cured, the batch of LEDs 10 may be separated for individual use. Once separated, the conformally coated LED 10 may include a conformal coating edge 71 that extends from the base of the LED and that may have a bottom surface that is substantially coplanar with the bottom surface of the LED 10. When the conformally coated emitter 10 is mounted to a conventional substrate and placed into service, thermal energy that is produced by the LED 10 may be conductively transferred to the conformal coating. As the conformal coating 70 may have a higher coefficient of thermal expansion than the LED 10, the edge portions 71 of the conformal coating 70 may exert a downward pressure against the substrate 50, causing the LED 10 to lift and partially, and or fully separate from the substrate 50. Such separation may result in low yields of functional devices.

One or more solder connections (not shown) may bond the LED 10 to the substrate 50. If the area of the solder connection is reduced as a result of separation between the LED 10 and the substrate 50, an open and/or high resistance electrical condition may result. In the case of a high resistance condition, the current density may be unfavorably increased. In some cases, the heating that occurs in the soldering and/or bonding operation may heat the conformal coating sufficiently to cause the LED 10 to lift from the substrate 50 before the solder has solidified.

Figure 14:
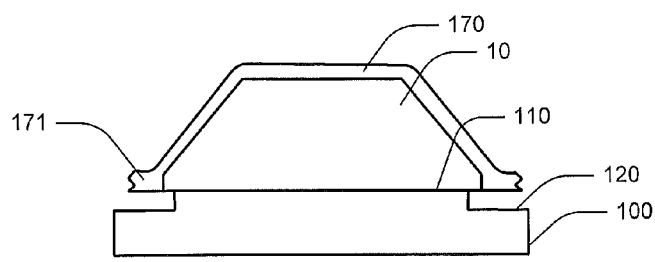
FIG. 14 is a schematic side cross-sectional view illustrating a conformally coated semiconductor device mounted on a substrate according to some embodiments of the present invention.
Figure 15:
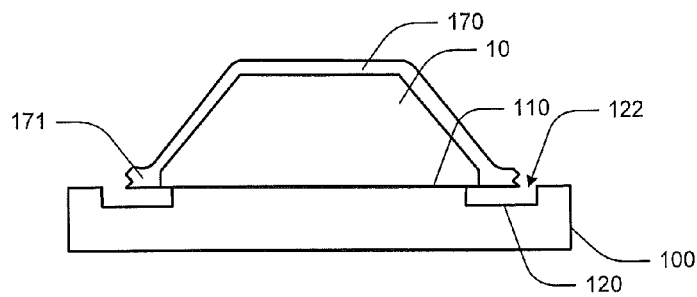
FIG. 15 is a schematic side cross-sectional view illustrating a conformally coated semiconductor device mounted on a substrate according to some embodiments of the present invention.

Reference is now made to FIGS. 14 and 15, which are each a schematic side cross-sectional view illustrating conformally coated semiconductor devices mounted on different respective substrates according to some embodiments of the present invention. As discussed above regarding FIG. 13, a conformal coating 170 may be applied to an LED 10. Referring to FIG. 14, the conformally coated LED 10 may be mounted to a mounting portion 110 of the substrate 100. A relief portion 120 may surround the mounting portion 110. The mounting and relief portions 110, 120 may be dimensioned such that the LED 10 may overlap a part of the relief portion 120. As a result, an edge portion 171 of the conformal coating 170 may be positioned over the relief portion 120 of the substrate 100 and thus not be in contact with the substrate 100.

While the mounting portion 110 of may be formed as a pedestal on the top surface of the substrate 100, FIG. 15 illustrates that the relief portion 120 may be configured as a trench that surrounds the mounting portion 110. In this regard, the edge portion 171 may be positioned over a cavity 122 defined by the trench.

Whether implemented as a pedestal or a trench, the mounting and relief portions 110, 120 provide that the edge portion 171 of the conformal coating 170 may not be in direct contact with the substrate 100. In this regard, if the conformal coating 170 experiences structural and/or dimensional deformity due to thermal or other conditions, forces which would tend to separate the LED 10 from the substrate 100 may be avoided. Some embodiments provide that the cavity 122 may be partially and/or fully filled using a material having a lower elastic modulus than the conformal coating 170. For example, a more flexible, pliable and/or compressible material may be provided in the cavity 122.

Figure 16:
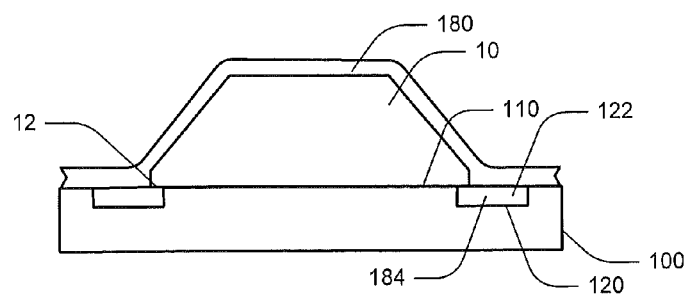
FIG. 16 is a schematic side cross-sectional view illustrating a conformally coated semiconductor device mounted on a substrate according to some embodiments of the present invention.

Reference is now made to FIG. 16, which is a schematic side cross-sectional view illustrating a conformally coated semiconductor device mounted on a substrate according to some embodiments of the present invention. As discussed above, the semiconductor device may include an LED 10, however, the invention is not so limited. A filler material 184 may be provided in a cavity 122 that is defined by a trench in the relief portion 120 of the substrate 100. The LED 10 may be mounted to the substrate 100. Once the LED 10 is mounted to the substrate 100 and the filler material 184 is in the cavity, a conformal coating 180 may be applied thereon. As discussed herein, the conformal coating 180 may include optical materials that are operable to modify the emission characteristics of light received from the LED 10.

By filling the cavity 122 with the filler material 184 before applying the conformal coating 180, the conformal coating 180 may be prevented from filling the cavity 122 and more particularly from getting under a bottom surface 12 of the LED 10. In this regard, upward forces applied to the LED 10 based on expansion of the conformal coating 180 may be avoided.

Some embodiments provide that the filler material 184 may be a material having a lower elastic modulus and/or a lower coefficient of thermal expansion than the conformal coating 180 and/or the LED 10. For example, the filter material 184 may be a more flexible, pliable and/or compressible material relative to the LED and/or the conformal coating 180. For example, the filler material 184 may be used to impede the conformal coating 180 from getting under the LED 10. Filler materials may include a silicone gel and/or a polymer, including, for example, a photo-imageable polymer that may be used as a solder mask. Other such materials including a low coefficient of thermal expansion and/or a low elastic modulus may also be used.

Figure 17:
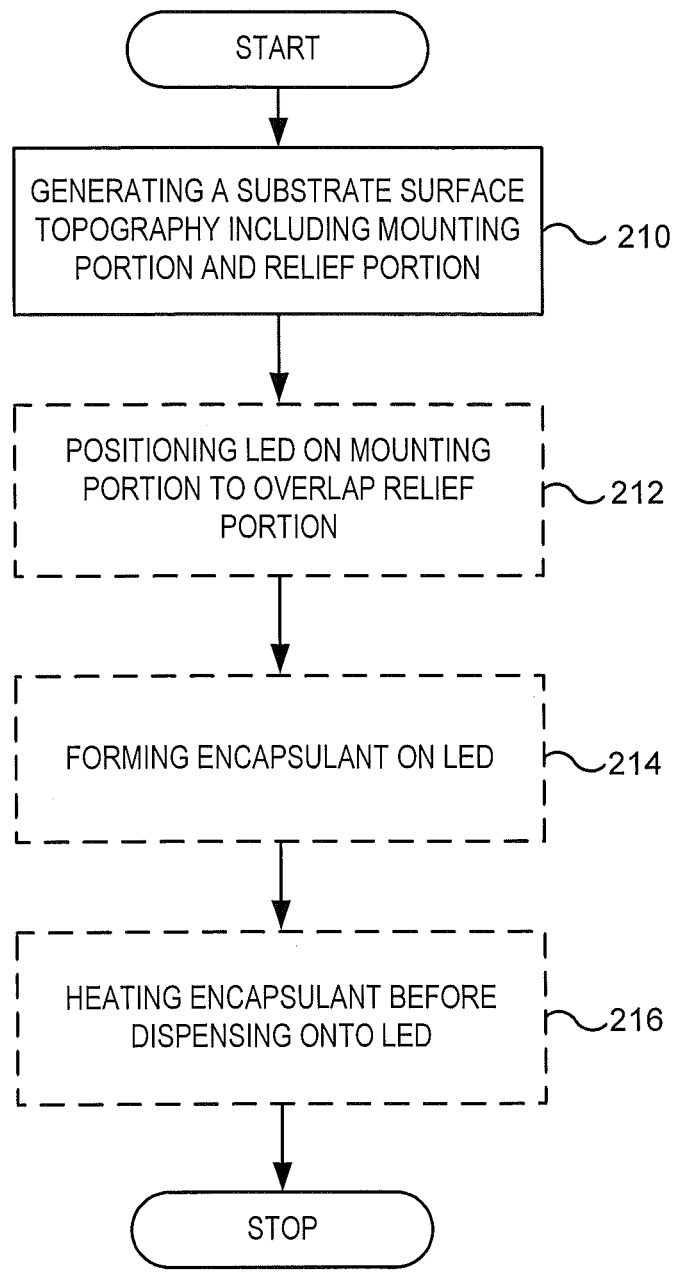
FIG. 17 is a flow chart illustrating operations for providing a substrate according to some embodiments of the present invention.

Reference is now made to FIG. 17, which is a flow chart illustrating operations for providing a substrate according to some embodiments of the present invention. Operations may include generating a substrate surface topography that includes a mounting portion and a relief portion (block 210). The mounting portion may be higher than the relief portion. For example, the relief portion may substantially define a perimeter of the mounting portion. Some embodiments provide that the substrate surface topography is generated by providing a trench in the substrate that corresponds to the relief portion. The trench may substantially define the perimeter of the mounting portion. The trench may be formed by removing substrate material by etching, cutting, and/or grinding, among others. Some embodiments provide that the trench may be defined by building up a pattern of material on non-trench portions of the substrate. For example, the mounting portion on the substrate may be built up using one or more layers of mounting surface material.

Operations may include positioning a semiconductor light emitting diode (LED) on the mounting portion in a position overlap the relief portion (block 212). For example, bottom edges of the LED may extend beyond a perimeter of the mounting portion to overlap part of the relief portion. In this regard, once the LED is positioned on the mounting portion of the substrate, the top surface of the mounting portion may be entirely covered by the LED.

An encapsulant may be formed on the LED that is mounted on the substrate (block 214). As described herein, the encapsulant may include multiple types and/or quantities of light conversion particles. The encapsulant may form a meniscus that extends beyond the mounting portion and that does not contact the top surface of the mounting portion that is covered by the LED. Forming the encapsulant may include dispensing a fluid volume of the encapsulant in a mini-glob on a top surface of the LED.

The relief portion that is adjacent the mounting portion may define a cavity that allows the meniscus to remain untouched by the substrate. In this manner, the meniscus forces may not be disrupted by contact with the substrate and the encapsulant may retain the meniscus form. Absent the relief portion, the meniscus might otherwise contact the substrate surface and spread out on the substrate beyond the LED, which may result in reduced uniformity and/or increased materials cost associated with the encapsulant materials that do not receive light emissions from the LED.

Some embodiments provide that the meniscus may sag before the encapsulant cures. In this regard, the encapsulant may extend into a cavity corresponding to the relief portion. This effect may be more pronounced as the viscosity of the encapsulant increases. However, an increase in viscosity of the encapsulant may provide increasing uniformity in the tear-off characteristics of the encapsulant, which may result in a corresponding increase in uniformity regarding the amount of encapsulant that is dispensed. In this regard, the encapsulant may be heated before dispensing onto the LED (block 216). The increase in viscosity of the encapsulant may weaken the cohesive forces that provide the meniscus, resulting in a more fragile meniscus. Accordingly, providing a relief portion that allows the bottom areas of the meniscus to be untouched by the substrate may allow the meniscus to remain intact.

Although not illustrated, the dimensional properties of the LED may be less than those of the mounting portion and thus not extend over the relief portion. In this regard, the mounting surface may serve as a meniscus control feature.

Figure 18:
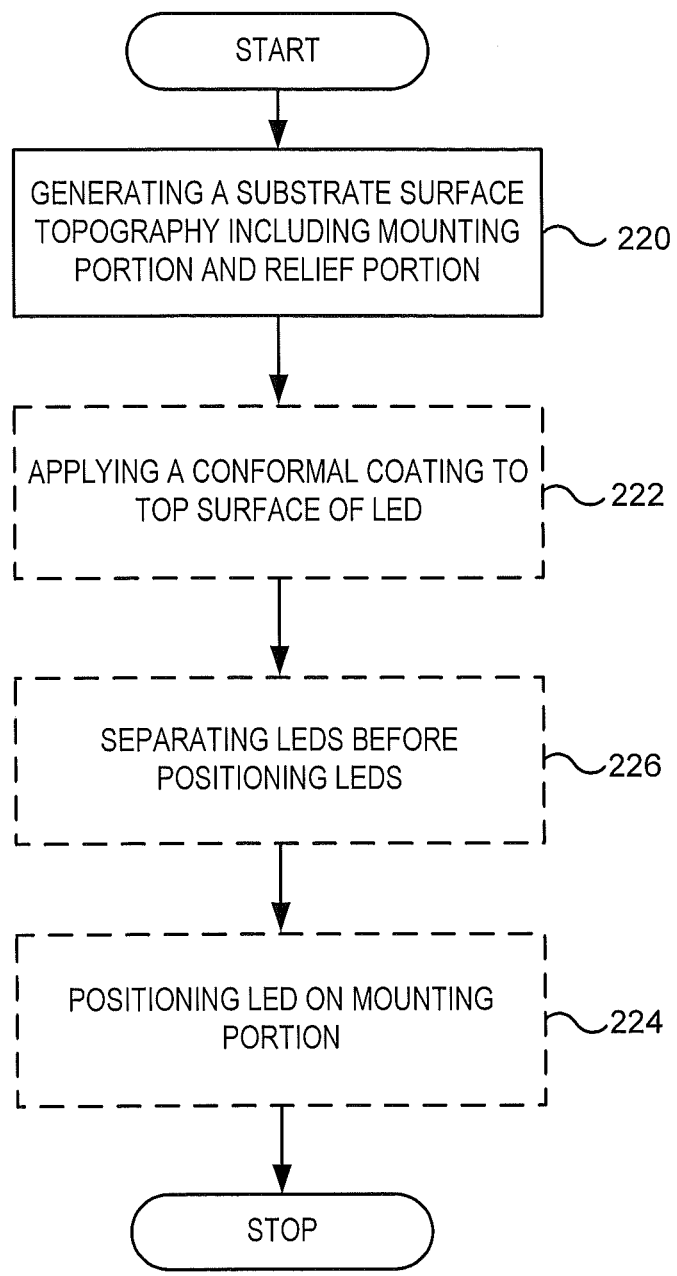
FIG. 18 is a flow chart illustrating operations for providing a substrate according to some embodiments of the present invention.

Reference is now made to FIG. 18, which is a flow chart illustrating operations for providing a substrate according to some embodiments of the present invention. Operations may include generating a substrate surface topography that includes a mounting portion and a relief portion (block 220). Operations corresponding to generating the substrate topography are described in detail above and thus a duplicate discussion thereof is not provided in the foregoing discussion.

Operations may include, applying a conformal coating to a top surface of the LED (block 222). Some embodiments provide that the conformal coating may be applied to multiple LEDs on a wafer and/or that are arranged in an array, such as, for example, a sorted die array. For example, an LED wafer may include a plurality of thin epitaxial layers that define a light emitting diode structure. The epitaxial layers are supported by a substrate that can include a growth substrate and/or a carrier substrate. The epitaxial region of the LED wafer can be divided into a plurality of discrete device regions, for example, by mesa and/or implant isolation. In some embodiments, dicing streets (i.e. linear regions where the wafer is to be diced using a dicing saw) and/or scribe lines may already be formed in the LED wafer. A plurality of electrical contacts may be formed on the LED wafer.

Figure 20A:
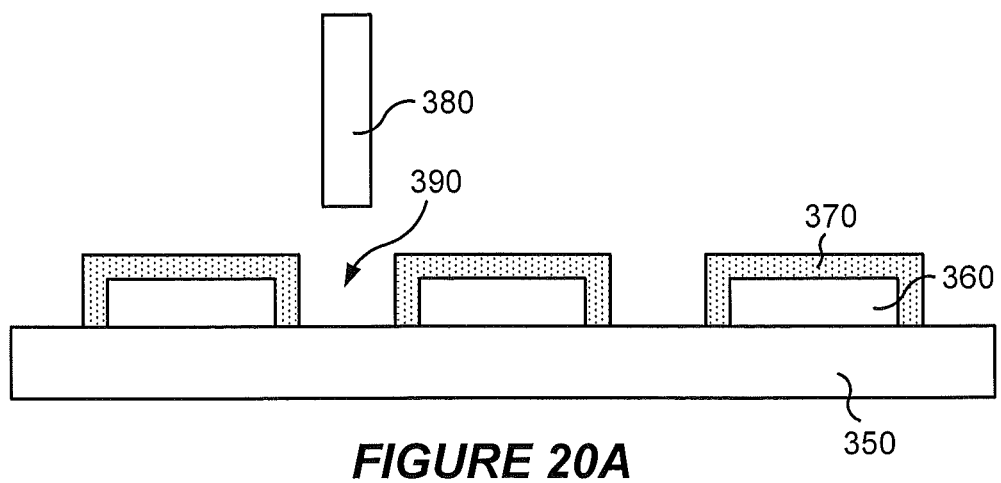
FIGS. 20A and 20B are cross sectional views illustrating the dicing of light emitting diode structures including discrete phosphor-bearing regions according to some embodiments of the invention.
Figure 20B:
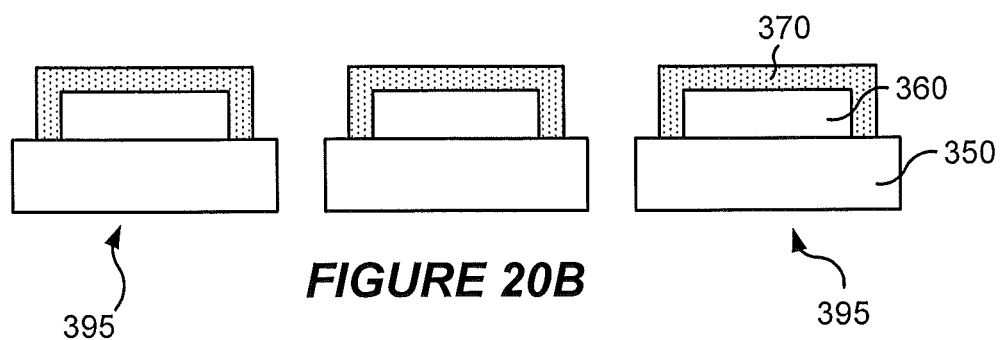

For example, brief reference is made to FIGS. 20A and 20B, which are cross sectional views illustrating the dicing of light emitting diode structures including discrete phosphor-bearing regions according to some embodiments of the invention. As shown therein, a wafer 350 includes a plurality of light emitting devices 360 thereon. The wafer 350 may be a growth wafer on which the light emitting devices are grown and/or may be a carrier wafer on which the light emitting devices have been mounted. The light emitting devices 360 include a plurality of discrete phosphor-containing regions thereon, which are illustrated schematically by the layers 370 on the light emitting devices 360. Regions 390 between the light emitting devices 360, which may correspond to saw streets, may not include the discrete phosphor-containing regions 370. For example, brief reference is made to FIG. 11B, illustrating that the wafer 350 may be diced to provide individual light emitting diodes 395 including discrete phosphor-containing regions 370 thereon.

A sacrificial pattern may be formed on the electrical contacts. The sacrificial pattern can include a material such as soluble polymer and/or glass, which can be applied and patterned using conventional photolithographic techniques. The sacrificial pattern can be aligned with the underlying electrical contacts. Alternatively, the sacrificial pattern can cover only portions of the electrical contacts, with some portions of the electrical contacts being exposed. In some embodiments, the sacrificial pattern can be wider than the electrical contacts, so that portions of the surface of the LED wafer adjacent the electrical contacts are also covered by the sacrificial patterns.

According to some embodiments, the conformal coating includes optical materials that may be sprayed onto the LEDs. Some embodiments provide that the conformal coating is applied using application techniques such as pouring, dipping, rolling, brushing and/or stamping, among others. The optical material may include wavelength conversion particles suspended in a solution including a volatile solvent and a binder material. Some embodiments provide that the volatile liquid is evaporated via, for example, thermal energy. Some embodiments provide that the solution includes a nonvolatile liquid that may be cured via, for example, thermal energy.

After separating the LEDs from one another (block 226), operations may include positioning an LED on the mounting portion of the substrate in a position that causes edges of the LED overlap and/or partially extend into and/or over the relief portion (block 224). In some embodiments, the edges of the conformal coating on the LED are positioned over a portion of a cavity that corresponds to the relief portion. In this manner, since the edge of the conformal coating may be over the cavity corresponding to the relief portion, if the conformal coating expands due to a change in thermal and/or other conditions, the edge portion of the conformal coating may not come into contact with the substrate. Accordingly, a separating bias applied to the LED relative to the substrate may be avoided.

Figure 19:
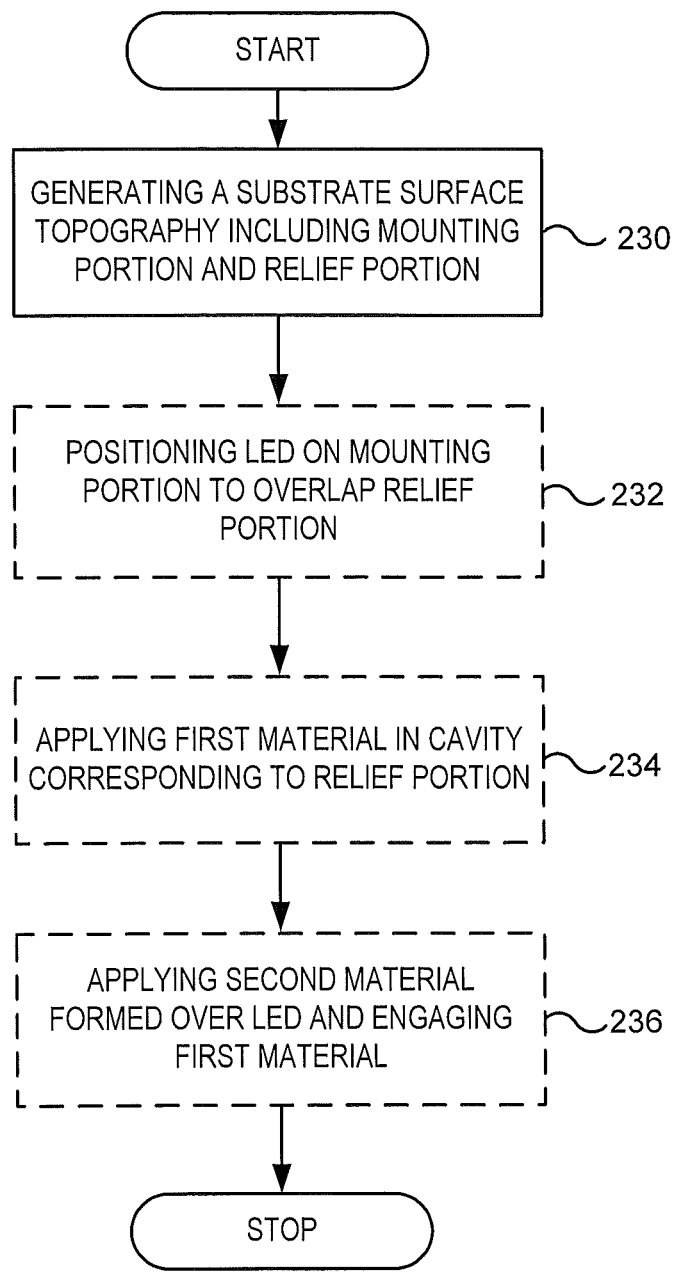
FIG. 19 is a flow chart illustrating operations for providing a substrate according to some embodiments of the present invention.

Reference is now made to FIG. 19, which is a flow chart illustrating operations for providing a substrate according to some embodiments of the present invention. Operations may include generating a substrate surface topography that includes a mounting portion and a relief portion (block 230) and positioning a semiconductor light emitting diode (LED) on the mounting portion in a position overlap the relief portion (block 232). Operations corresponding to generating the substrate topography and positioning the LED are described in detail above regarding FIG. 17 and thus a duplicate discussion thereof is not provided in the foregoing discussion.

Once the LED is positioned on the mounting surface, a first material may be applied to a cavity corresponding to the relief portion (block 234). In some embodiments, the first material may be a filler material that may include an elastic modulus corresponding to pliable, flexible, deformable and/or compressible characteristics. The filler material may substantially fill the relief portion cavity. For example, a trench corresponding to the relief portion may be filled with the filler material such that the space below the bottom edge of the LED that extends over the relief portion includes the filler material. In some embodiments, the filler material may completely and/or partially fill the cavity corresponding to the relief portion. Some embodiments provide that the cavity may be overfilled such that the volume of the filler material is slightly greater than the volume of the cavity.

A second material that is formed over the LED and that engages the filler material may be applied (block 236). The second material may be a conformal coating material that may include an elastic modulus that is greater than the elastic modulus of the filler material. For example, the conformal coating material may be similar to that discussed above regarding FIGS. 16 and 18. In some embodiments, the filler material includes a first coefficient of thermal expansion and the conformal coating material includes a second coefficient of thermal expansion that is greater than the first coefficient of thermal expansion.

Some embodiments provide that the filler material fills into a space that is below a bottom surface of the LED that extends beyond the mounting surface and over the relief portion. In this manner, when the conformal coating is subsequently applied, the conformal coating material may be prevented from flowing into the space below the edge of the LED that extends beyond the mounting surface. By preventing the conformal coating material to get under the edge of the LED, a lifting of the LED from the substrate due to expansion of the conformal coating material may be avoided.

Figure 21A:
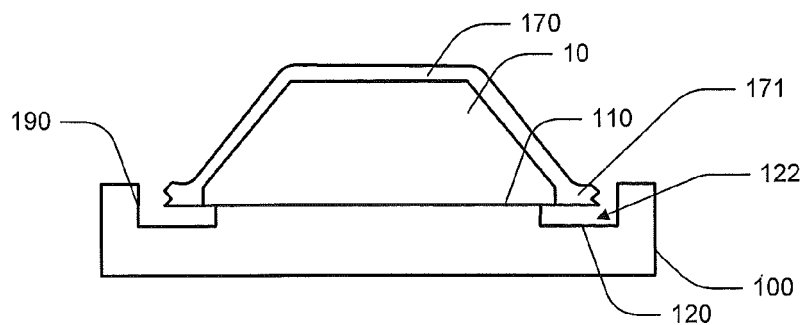
FIGS. 21A-21C are schematic side cross-sectional views illustrating a conformally coated semiconductor device mounted on different respective substrates according to some embodiments of the present invention.
Figure 21B:
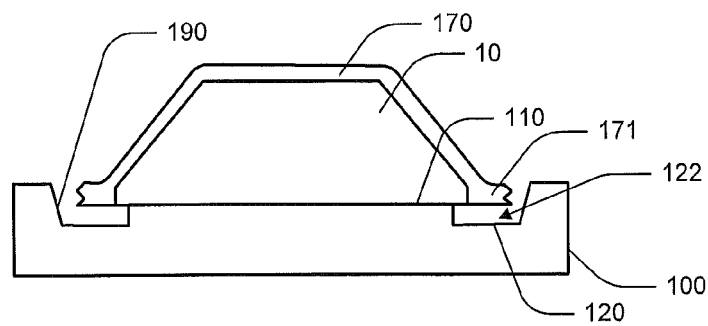
Figure 21C:
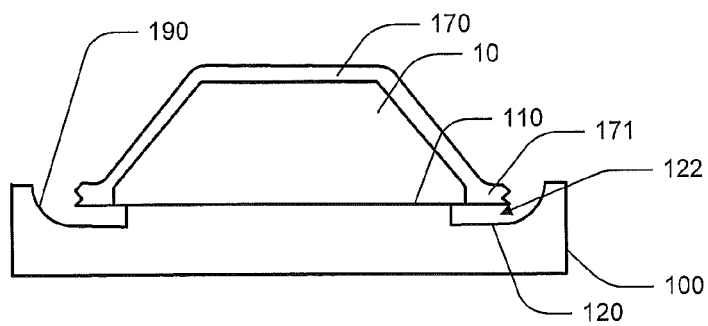

Reference is now made to FIGS. 21A-21C, which are schematic side cross-sectional views illustrating a conformally coated semiconductor device mounted on different respective substrates according to some embodiments of the present invention. As discussed above regarding FIGS. 14-15, a conformal coating 170 may be applied to an LED 10 and the conformally coated LED 10 may be mounted to a mounting portion 110 of the substrate 100. A relief portion 120 may surround the mounting portion 110. The mounting and relief portions 110, 120 may be dimensioned such that the LED 10 may overlap a part of the relief portion 120. As a result, an edge portion 171 of the conformal coating 170 may be positioned over the relief portion 120 of the substrate 100 and thus not be in contact with the substrate 100. The edge portion 171 may be positioned over a cavity 122 defined by the trench.

As illustrated in FIG. 21A, a reflecting surface 190 may be provided to receive light that is transmitted through the edge portion 171. The reflecting portion 190 may include a portion that is higher than the mounting portion 110. By reflecting the light from the edge portions 171, the far field color uniformity may be increased. As illustrated in FIG. 21A, the reflecting portion 190 may include a substantially orthogonal surface relative to a plane defined by the mounting portion 110, however, the disclosure is not so limited. For example, brief reference is made to FIG. 21B in which the reflecting portion 190 includes a surface that forms a substantially oblique angle relative to the mounting portion 110. Additionally, the reflecting portion 190 may include a substantially planar profile and/or a curvilinear profile as illustrated in FIG. 21C. In this manner, increased color uniformity at high angles may be provided according to embodiments herein.

Whether implemented as a pedestal or a trench, the mounting and relief portions 110, 120 provide that the edge portion 171 of the conformal coating 170 may not be in direct contact with the substrate 100. In this regard, if the conformal coating 170 experiences structural and/or dimensional deformity due to thermal or other conditions, forces which would tend to separate the LED 10 from the substrate 100 may be avoided. Some embodiments provide that the cavity 122 may be partially and/or fully filled using a material having a lower elastic modulus than the conformal coating 170. For example, a more flexible, pliable and/or compressible material may be provided in the cavity 122.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A light emitting structure, comprising:
a semiconductor light emitting diode (LED) comprising a first surface and a second surface that is substantially opposite the first surface;
an encapsulant that is a conformal layer directly on the LED and including ledges that extend from the perimeter of the LED; and
a mounting structure that includes a cavity around a mounting surface,
wherein the ledges of the encapsulant extend over a portion of the cavity without extending therein.

2. The light emitting structure according to claim 1, wherein the first surface includes a light emitting surface and wherein the second surface includes a mounting surface that is at a height below a height of the light emitting surface.

3. The light emitting structure according to claim 1, wherein the encapsulant includes a plurality of light conversion particles.

4. The light emitting structure according to claim 3, wherein at least one of the plurality of light conversion materials includes a phosphor particle.

5. The light emitting structure according to claim 1, wherein the LED has a first coefficient of thermal expansion and the encapsulant has a second coefficient of thermal expansion that is greater than the first coefficient of thermal expansion, and
wherein the cavity is configured to provide relief corresponding to thermal expansion of the conformal layer.

6. The light emitting structure according to claim 1, wherein the encapsulant comprises phosphor particles and a binder material.

* * * * *